United States Patent
Okubo et al.

(10) Patent No.: US 7,323,063 B2
(45) Date of Patent: Jan. 29, 2008

(54) APPARATUS FOR CHANGING CONCENTRATION OF TREATMENT SOLUTION AND TREATMENT SOLUTION SUPPLY APPARATUS

(75) Inventors: Takahiro Okubo, Kumamoto (JP); Hiroyuki Miyamoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 63 days.

(21) Appl. No.: 10/134,509

(22) Filed: Apr. 30, 2002

(65) Prior Publication Data

US 2002/0164414 A1 Nov. 7, 2002

(30) Foreign Application Priority Data

May 1, 2001 (JP) ............................. 2001-134103

(51) Int. Cl.
*B05D 1/00* (2006.01)
(52) U.S. Cl. ..................... 118/690; 118/689; 118/710; 118/712
(58) Field of Classification Search ................ 118/708, 118/684, 689, 690, 710, 712; 427/421, 8
See application file for complete search history.

(56) References Cited

U.S. PATENT DOCUMENTS 5,473,350 A * 12/1995 Mader et al. .................. 347/7
5,968,268 A 10/1999 Kitano et al.
6,059,880 A 5/2000 Kitano et al.

FOREIGN PATENT DOCUMENTS

JP 2002-324753 11/2002

* cited by examiner

*Primary Examiner*—George Koch
(74) *Attorney, Agent, or Firm*—Oblon, Spivak, McClelland, Maier & Neustadt, P.C.

(57) ABSTRACT

According to the present invention, in changing the concentration of a treatment solution supplied to a substrate, a volume of an existing treatment solution in a tank connected to a treatment solution supply section for supplying the treatment solution to the substrate is first measured. Based on this measured value, a minimum drain volume of the existing treatment solution to be drained out from the tank and a supply volume of either a treatment solution with a predetermined concentration or a diluting fluid to be supplied into the tank is calculated respectively in order to change the treatment solution in the tank to be in an intended volume and to have an intended concentration. Then, the calculated drain volume of the existing treatment solution is drained out from the tank. Meanwhile, the calculated supply volume of either the treatment solution with the predetermined concentration or the diluting fluid is supplied into the tank. According to the present invention, since the drain volume in changing the concentration of the treatment solution can be reduced, a wasteful consumption volume of the treatment solution is reduced accordingly so that cost reduction can be realized. Moreover, the time required for the concentration change can be shortened.

10 Claims, 14 Drawing Sheets

APPARATUS FOR CHANGING CONCENTRATION OF TREATMENT SOLUTION AND TREATMENT SOLUTION SUPPLY APPARATUS

BACKGROUND OF THE INVENTION

1. Field of the Invention

The present invention relates to a method for changing concentration of a treatment solution and a treatment solution supply apparatus.

2. Description of the Related Art

In a photolithography process in semiconductor device fabrication processes, solution treatments using treatment solutions such as a resist coating treatment of applying a resist solution to the surface of a wafer to form a resist film and a developing treatment of supplying a developing solution and a washing fluid to an exposed wafer to develop the wafer are carried out.

For example, the developing solution used in the developing treatment is conventionally stored in a large storage tank provided in a factory side with its concentration adjusted at a predetermined value following a recipe. Generally, this developing solution is supplied to a tank of a developing unit from the storage tank and temporarily stored there, and thereafter, it is supplied to a supply section for supplying the developing solution to the wafer, for example, a developing solution supply nozzle, from the tank of the developing unit when the developing treatment is carried out.

It is sometimes necessary to change the concentration of the developing solution when the recipe or the like of the wafer is changed. In this case, conventionally, the existing developing solution in the tank is completely drained out and a developing solution with a new concentration is prepared and stored again in the tank in order to change the concentration of the developing solution in the tank. Moreover, when the developing solution with the new concentration is stored, only a small volume of the developing solution left in the tank prevents strict maintenance of the concentration of the developing solution since the new developing solution and the existing developing solution are mixed together. Therefore, in changing the concentration of the developing solution, a troublesome work of once draining out the developing solution with the new concentration which is temporarily stored in the tank and storing a developing solution with the same concentration again has been carried out.

A large volume of the developing solution has to be drained out if the developing solution in the tank is thus completely drained out each time the concentration of the developing solution is changed and a large volume of the developing solution is consumed to cause cost increase. Furthermore, when the tank is large, it requires a lot of time to completely drain out the developing solution stored in this tank and thereafter, to supply the developing solution into the tank again and during that time, a wafer treatment is interrupted, which also causes a problem that a throughput is lowered.

SUMMARY OF THE INVENTION

The present invention is made in consideration of the above-described points, and it is an object of the present invention to reduce a wasteful drain volume of a treatment solution and shorten the time required for concentration change of the treatment solution in changing the concentration of various kinds of treatment solutions such as a developing solution.

In order to achieve the above object, the present invention is a method for changing a concentration of a treatment solution supplied to a substrate, comprising the step of measuring a volume of an existing treatment solution in a tank connected to a treatment solution supply section for supplying the treatment solution to the substrate. The present invention also comprises the step of calculating, based on a value measured in the above step, a minimum drain volume of the existing treatment solution to be drained out from the tank and a supply volume of either a treatment solution with a predetermined concentration or a diluting fluid to be supplied into the tank respectively in order to change the treatment solution in the tank to be in an intended volume and to have an intended concentration. The present invention also comprises the step of draining out the calculated drain volume of the existing treatment solution from the tank and the step of supplying the calculated supply volume of either the treatment solution with the predetermined concentration or the diluting fluid into the tank.

It is acceptable that the concentration of the treatment solution in the tank is measured after the calculated supply volume of either the treatment solution with the predetermined concentration or the diluting fluid is supplied into the tank, and the treatment solution with the predetermined concentration or the diluting fluid is supplied into the tank again based on the measured concentration. Furthermore, the existing treatment solution remaining in a pipe connecting the tank and the treatment solution supply section may be returned into the tank before the volume of the existing treatment solution in the tank is measured.

According to the present invention, when the concentration of the treatment solution is to be changed, the volume of the existing treatment solution in the tank is first measured, and based on this measured value, the minimum drain volume of the treatment solution to be drained out from the tank and the supply volume of either the treatment solution with the predetermined concentration or the diluting fluid to be added are calculated in order to finally obtain the intended volume of the treatment solution with the intended concentration in that tank. At this time, when the intended concentration is higher than the concentration of the existing treatment solution, the supply volume of the treatment solution with the predetermined concentration to be added is calculated, while, when the intended concentration is lower than the concentration of the existing treatment solution, the supply volume of the diluting fluid to be added is calculated. Then, based on the calculated drain volume and supply volume, the existing treatment solution in the tank is drained out and either the treatment solution with the predetermined concentration or the diluting fluid is supplied into the tank. Therefore, according to the present invention, it is not necessary to completely discard the existing treatment solution stored in the tank and only the minimum volume needs to be discarded so that the drain volume is reduced. Moreover, since the drain volume of the existing treatment solution and the supply volume of the diluting fluid or the like are calculated taking the volume of the treatment solution to be finally stored in the tank into consideration, it is possible to change the concentration of the treatment solution regardless of the capacity of the tank by supplying such a volume of the diluting fluid or the like that the treatment solution after the diluting fluid or the like is added can be accommodated in the tank.

According to another aspect of the present invention, the present invention is a treatment solution supply apparatus for supplying a treatment solution to a substrate, comprising: a tank for storing the treatment solution; a pipe for connecting a treatment solution supply section for supplying the treatment solution to the substrate and the tank; a treatment solution supply pipe for supplying the treatment solution with a predetermined concentration into the tank; a diluting fluid supply pipe for supplying a diluting fluid into the tank; a solution volume sensor for measuring a solution volume in the tank; and a drainpipe for draining out the treatment solution from the tank. The treatment solution supply apparatus according to the present invention further comprises an arithmetic unit for calculating a drain volume of the existing treatment solution to be drained out from the drainpipe and calculating a supply volume of the treatment solution with the predetermined concentration to be supplied from the treatment solution supply pipe or a supply volume of the diluting fluid to be supplied from the diluting fluid supply pipe respectively, in order to change the existing treatment solution in the tank to be in an intended volume and to have an intended concentration; a supply control unit for controlling the supply volume from the treatment solution supply pipe and the diluting fluid supply pipe based on a resultant value of the calculation; and a drain control unit for controlling a drain volume of the existing treatment solution from the drainpipe based on a resultant value of the calculation.

According to the treatment solution supply apparatus of the present invention, the drain volume to be drained out from the drainpipe and the supply volume of the treatment solution with the predetermined concentration to be supplied from the treatment solution supply pipe or the supply volume of the diluting fluid to be supplied from the diluting fluid supply pipe can be calculated by the arithmetic unit in changing the concentration of the treatment solution in the tank. Moreover, the supply to the tank and the drain from the tank can be controlled by the supply control unit and the drain control unit respectively based on the calculated values so that the method for changing the concentration of the treatment solution of the present invention can be carried out appropriately. Therefore, the drain volume of the treatment solution is reduced compared with a conventional method in which the existing developing solution in the tank is completely discarded in changing the concentration.

Incidentally, when the treatment solution supply apparatus of the present invention is so structured that another diluting fluid supply pipe for supplying the diluting fluid is connected to the pipe and a stirring unit is provided between a downstream side of a connecting portion where the aforesaid another diluting fluid supply pipe and the pipe are connected and the treatment solution supply section, the concentration of the treatment solution supplied from the treatment solution supply section can be freely changed by controlling the flow rate of the diluting fluid supplied from the aforesaid another diluting fluid supply pipe.

DETAILED DESCRIPTION OF THE PREFERRED EMBODIMENTS

Figure 1:
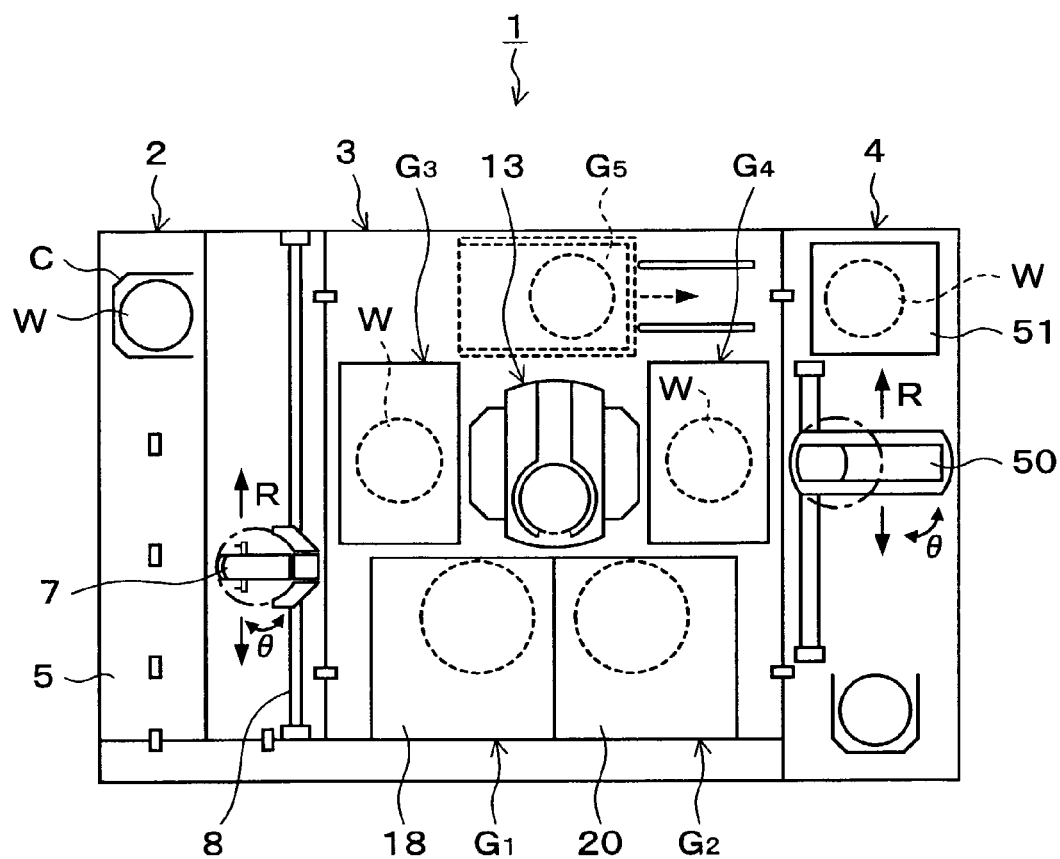
FIG. 1 is a plan view showing a diagrammatic structure of a coating and developing system including a developing solution supply apparatus according to an embodiment.
Figure 2:
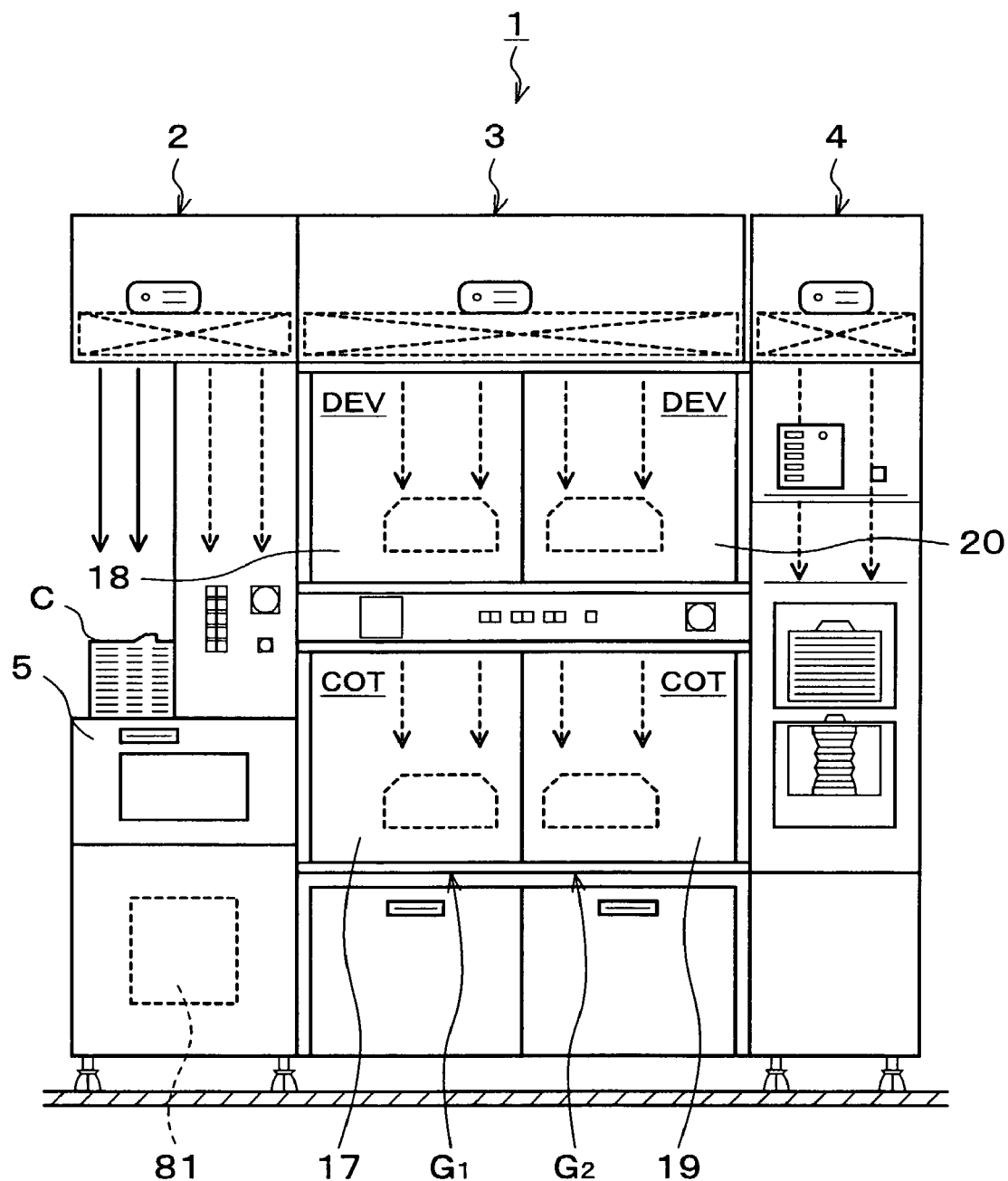
FIG. 2 is a front view of the coating and developing system in FIG. 1.
Figure 3:
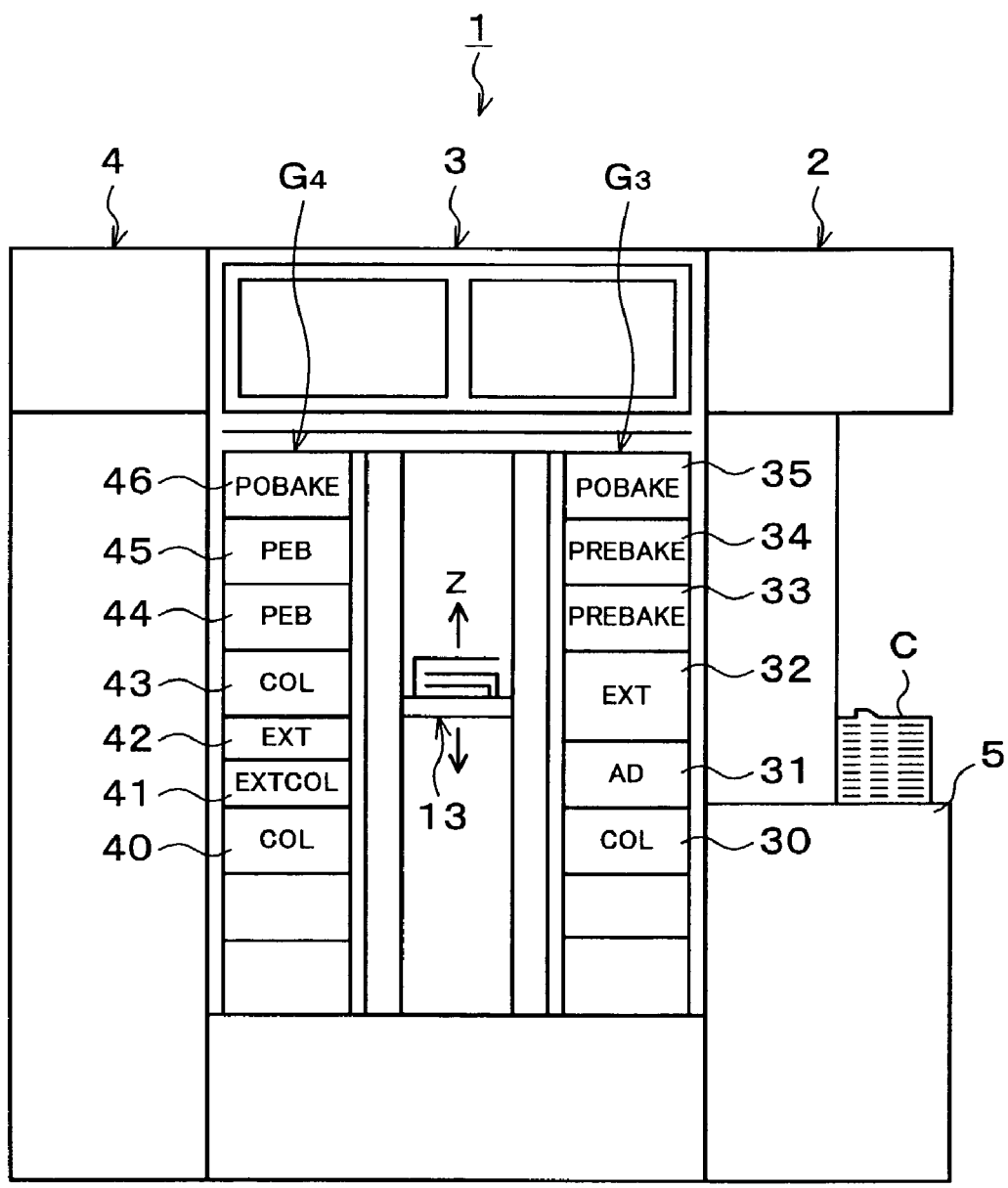
FIG. 3 is a rear view of the coating and developing system in FIG. 1.

A preferred embodiment of the present invention will be explained below. FIG. 1 is a plan view diagrammatically showing a coating and developing system 1 including a developing solution supply apparatus as a treatment solution supply apparatus according to this embodiment, FIG. 2 is a front view of the coating and developing system 1, and FIG. 3 is a rear view of the coating and developing system 1.

As shown in FIG. 1, the coating and developing system 1 has a structure in which a cassette station 2 for carrying, for example, 25 wafers W from/to the outside to/from the coating and developing system 1 in the unit of cassette and for carrying the wafers W into/from a cassette C, a processing station 3 with various kinds of processing units disposed in multi-tiers for performing predetermined processing wafer by wafer in a coating and developing process, and an interface section 4 provided adjacent to the processing station 3, for receiving and delivering the wafer W from/to an aligner which is not shown, are integrally connected.

In the cassette station 2, a plurality of the cassettes C are mountable at a predetermined position on a cassette mounting table 5 serving as a mounting section in a line in an R-direction (a vertical direction in FIG. 1). Further, a wafer carrier 7, which is transferable in the direction of this cassette alignment (the R-direction) and in the direction of the wafer alignment of the wafers W housed in the cassette C (a Z-direction; a perpendicular direction), is provided to be movable along a carrier guide 8 and is selectively accessible to each of the cassettes C.

The wafer carrier 7 has an alignment function for aligning the wafer W. This wafer carrier 7 is structured so as to be also accessible to an extension unit 32 included in a third processing unit group G3 on the side of the processing station 3 as will be described later. In a lower part of the cassette station 2, a tank 81 described later is provided as shown in FIG. 2.

In the processing station 3, a main carrier 13 is provided in a center part thereof, and various kinds of processing units are multi-tiered on the periphery of the main carrier 13 to compose processing unit groups. In the coating and developing system 1, there are four processing unit groups G1, G2, G3 and G4, and the first and second processing unit groups G1 and G2 are disposed on the front side of the coating and developing system 1, the third processing unit group G3 is disposed adjacent to the cassette station 2, and the fourth processing unit group G4 is disposed adjacent to the interface section 4. Further, as an option, a fifth processing unit group G5 depicted by a broken line can be additionally arranged on the rear side. The main carrier 13 can carry the wafer W into/from various kinds of later-described processing units disposed in these processing unit groups G1 to G5. Incidentally, the number and the arrangement of the processing unit groups can be selected freely.

In the first processing unit group G1, for example, as shown in FIG. 2, a resist coating unit 17 for supplying a resist solution to the wafer to form a resist film and a developing unit 18 for developing the exposed wafer W are two-tiered in the order from the bottom. Similarly, in the second processing unit group G2, a resist coating unit 19 and a developing unit 20 are two-tiered in the order from the bottom.

In the third processing unit group G3, for example, as shown in FIG. 3, a cooling unit 30 for cooling the wafer W, an adhesion unit 31 for increasing fixability between the resist solution and the wafer W, the extension unit 32 for keeping the wafer W on stand-by therein, pre-baking units 33 and 34 for drying a solvent in the resist solution, and a post-baking unit 35 for performing heating processing after the developing treatment are, for example, seven-tiered in the order from the bottom.

In the fourth processing unit group G4, for example, a cooling unit 40, an extension and cooling unit 41 for spontaneously cooling the placed wafer W, an extension unit 42, a cooling unit 43, post-exposure baking units 44 and 45 for performing heating processing after the exposure treatment, and a post-baking unit 46 are, for example, eight-tiered in the order from the bottom.

In a center part of the interface section 4, a wafer carrier 50 is provided. This wafer carrier 50 is structured so as to be movable in the R-direction (the vertical direction in FIG. 1) and the Z-direction (the perpendicular direction), and to be rotatable in a θ-direction (a rotational direction about an axis Z), so that it can access the extension and cooling unit 41 and the extension unit 42 which are included in the fourth processing unit group G4, an edge exposure unit 51, and a not-shown aligner to carry the wafer W to each of them.

Figure 4:
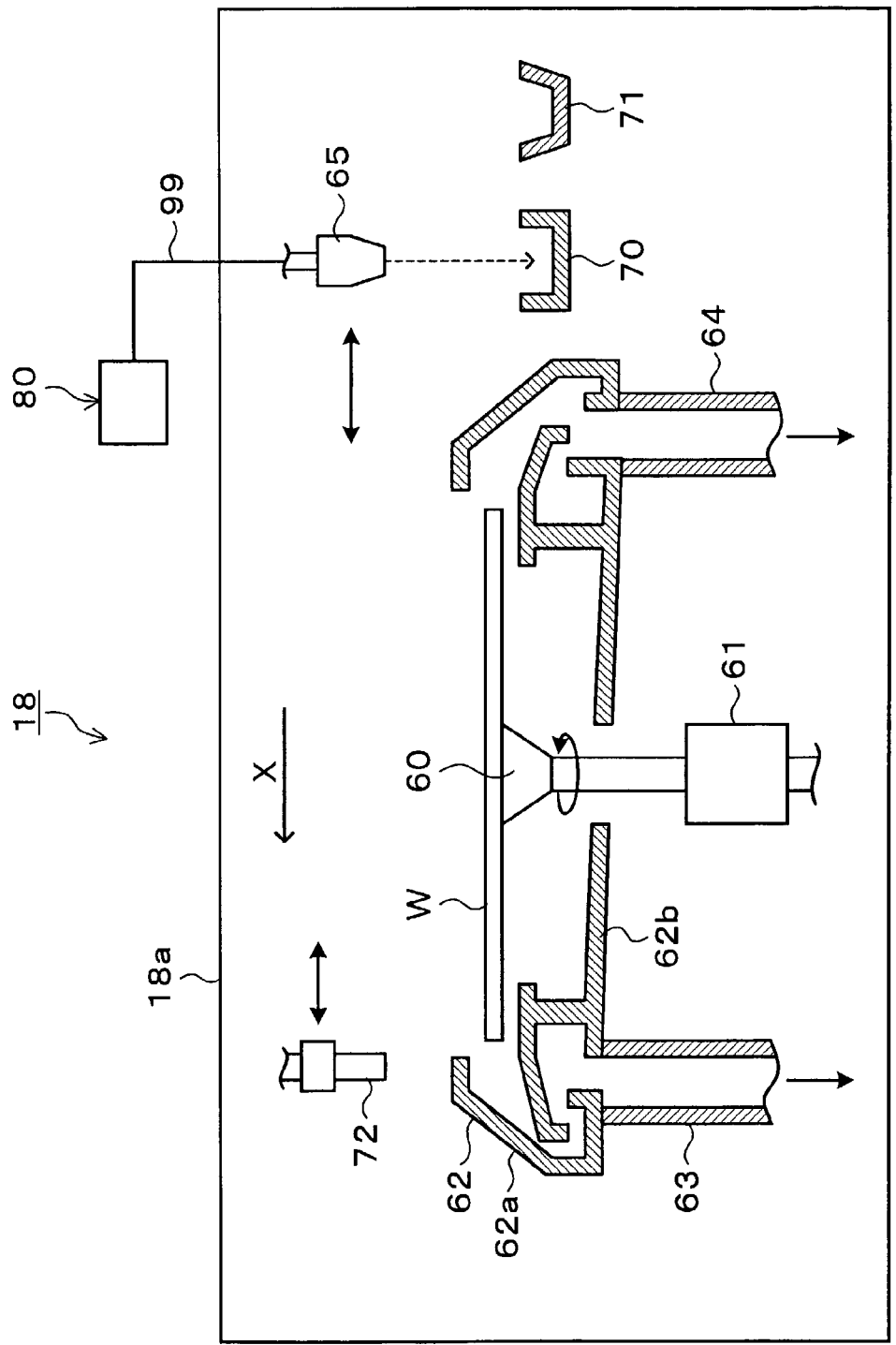
FIG. 4 is an explanatory view of a vertical cross section of a developing unit included in the coating and developing system.

Next, the structure of the developing unit 18 mentioned above will be explained in detail. As shown in FIG. 4, in a casing 18a of the developing unit 18, a spin chuck 60 for holding the wafer W is disposed. The spin chuck 60 has a horizontal upper surface so that it can hold the wafer W horizontally. The spin chuck 60 has on its upper surface, for example, a not shown suction port so that the spin chuck 60 can hold the wafer W by suction by sucking the rear surface of the wafer W. In a lower part of the spin chuck 60, a drive mechanism 61 for rotating the spin chuck 60 at an intended speed is provided. The drive mechanism 61 enables the spin chuck 60 to move in a vertical direction.

Outside the spin chuck 60, a cup 62 surrounding the wafer W held horizontally is provided. The cup 62 includes a side portion 62a surrounding a side part of the wafer W held on the spin chuck 60 and a bottom portion 62b covering a lower surface of the wafer W, with an upper part thereof being open. A developing solution or the like scattered or dropped from the wafer W is received in the cup 62. In the bottom portion 62b of the cup 62, a drainpipe 63 for draining out a treatment solution received in the cup 62 and an exhaust duct 64 for exhausting an atmosphere inside the cup 62 are provided. The developing solution or the like received in the side portion 62a and so on of the cup 62 is drained out from the drainpipe 63 and the atmosphere inside the cup 62 containing mist of the developing solution or the like is exhausted from the exhaust duct 64.

A developing solution supply nozzle 65 as a treatment solution supply section supplies the developing solution to the wafer W and is supported by a not-shown arm. A not-shown drive section enables the arm to move in an X-direction (a horizontal direction in FIG. 4) and the movement of the arm enables the developing solution supply nozzle 65 to move horizontally above the cup 62.

Figure 5:
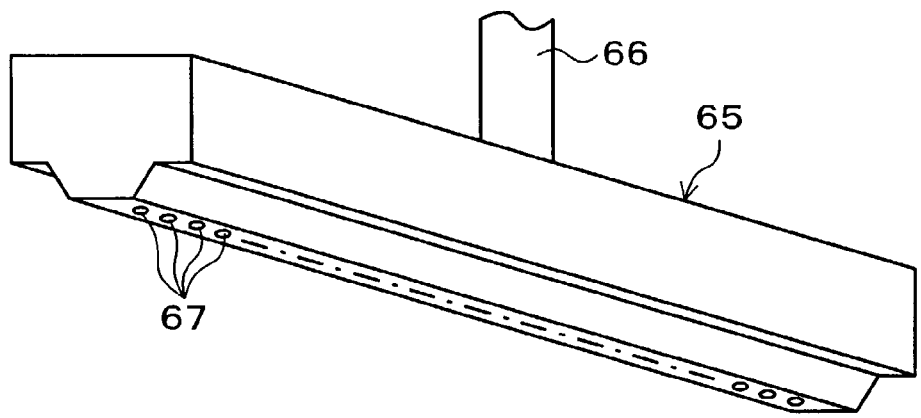
FIG. 5 is a perspective view of a developing solution supply nozzle included in the developing unit.

The developing solution supply nozzle 65 has an elongate shape as shown in FIG. 5 and the length thereof is larger than, for example, the diameter of the wafer W. The developing solution supply nozzle 65A has on its upper surface a connecting portion 66 for connecting a later-described pipe 99 therewith and in a lower surface of the developing solution supply nozzle 65, a plurality of discharge ports 67 for discharging the developing solution onto the wafer W are disposed in a line along its longitudinal direction.

Figure 6:
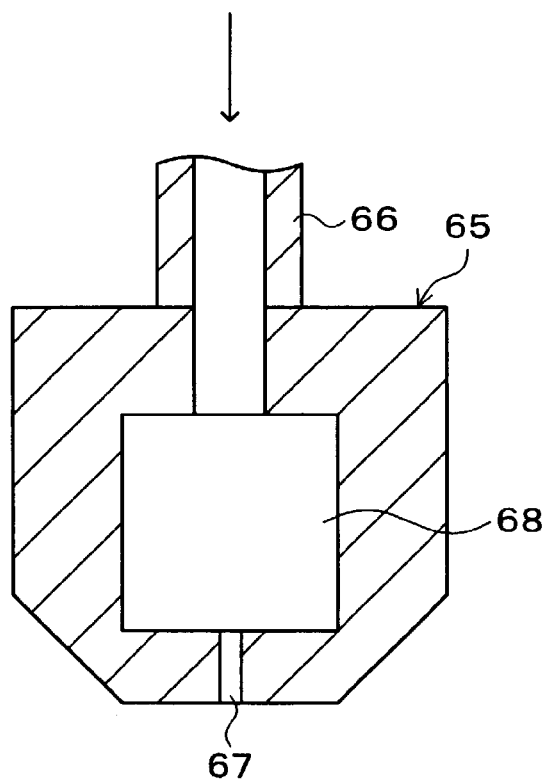
FIG. 6 is an explanatory view of a vertical cross section of the developing solution supply nozzle.

Inside the developing solution supply nozzle 65, a storage portion 68 for temporarily storing the developing solution flowing therein from the connecting portion 66 is provided as shown in FIG. 6, and the developing solution temporarily stored in the storage portion 68 is synchronously discharged from the plural discharge ports 67 at the same flow rate. The developing solution supply nozzle 65 is supported by the not-shown arm in a manner that its longitudinal direction makes a perpendicular direction to the X-direction and it moves in the X-direction while discharging the developing solution so that the developing solution can be supplied onto the entire surface of the wafer W.

Outside the cup 62, a receiving vessel 70 for receiving the developing solution discharged as a test when the developing solution supply nozzle 65 performs the test discharge is provided. The plane shape of the receiving vessel 70 is larger than that of the developing solution supply nozzle 65. Further outside the receiving vessel 70, a washing tank 71 for keeping the developing solution supply nozzle 65 on stand-by and washing it is provided. The washing tank 71 has a vessel shape with its upper part open and can store a washing fluid for washing away the developing solution therein.

A washing fluid supply nozzle 72 for supplying the washing fluid onto the wafer W is supported by a not-shown arm, and by this arm, the washing fluid supply nozzle 72 can be transferred to a position above the center of the wafer W held on the spin chuck 60. Consequently, the washing fluid supply nozzle 72 can supply the washing fluid onto the center of the wafer W from above.

Next, the structure of a developing solution supply apparatus 80 for supplying the developing solution with an intended concentration to the developing solution supply nozzle 65 will be explained.

Figure 7:
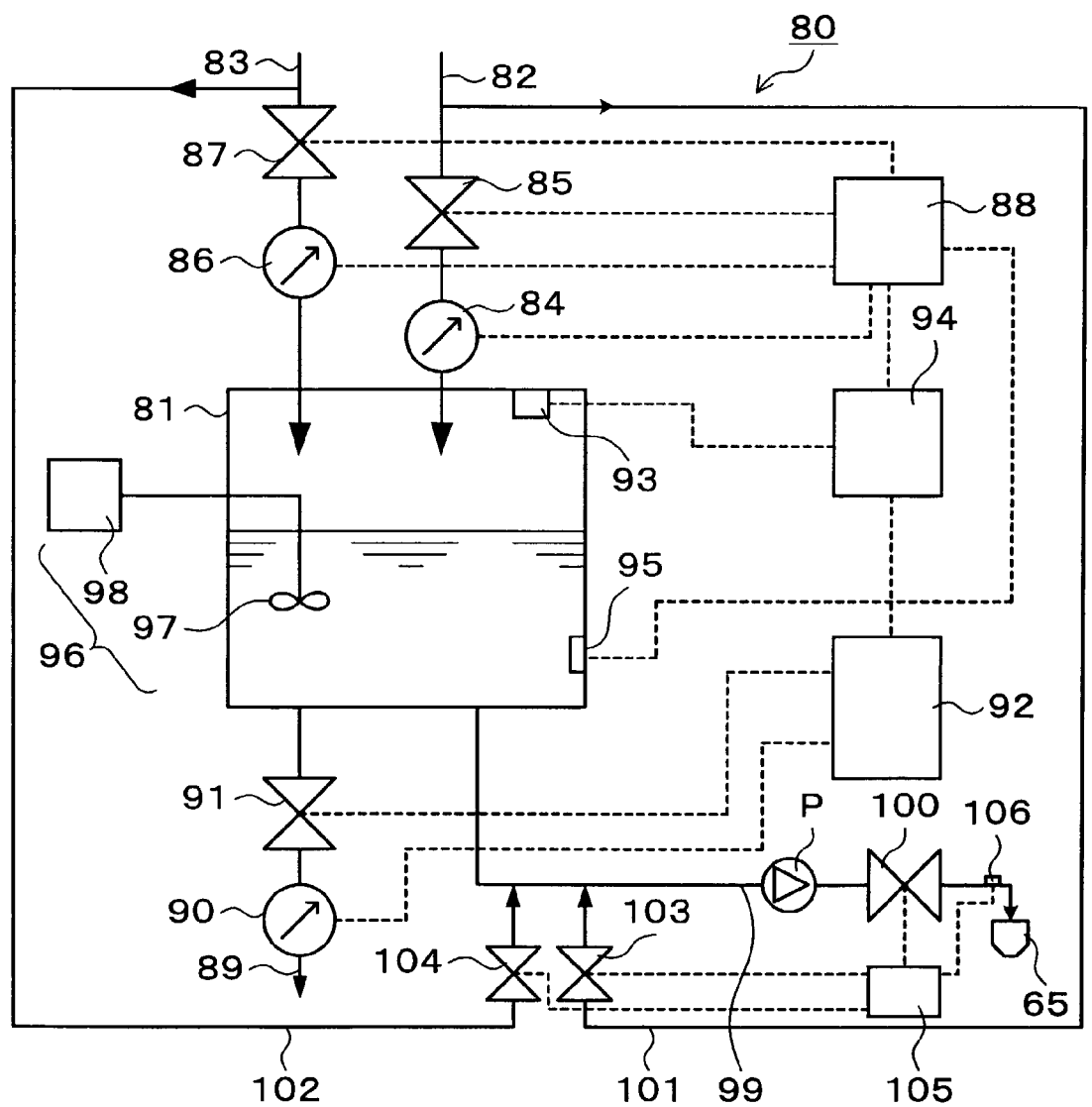
FIG. 7 is an explanatory view schematically showing the structure of the developing solution supply apparatus.

The developing solution supply apparatus 80 includes the tank 81 as a concentration adjusting storage section in which the concentration of the developing solution is adjusted as shown in FIG. 7. The tank 81 is disposed in the lower part of the cassette station 2 as previously described. A supply pipe 82 for supplying the developing solution with a predetermined high concentration into the tank 81 from a not-shown factory-side storage tank and a supply pipe 83 for supplying a diluting fluid, for example, pure water, into the tank 81 from a not-shown diluting fluid supply source are connected to an upper part of the tank 81. Incidentally, the developing solution with a higher concentration than the concentration of the developing solution used in the developing treatment is supplied from the supply pipe 82.

A flowmeter 84, which is, for example, an integrating meter, and a flow rate adjusting valve 85 are provided in the supply pipe 82. A flowmeter 86 as an integrating meter and a flow rate adjusting valve 87 are provided in the supply pipe 83. The flowmeters 84 and 86 can output their measured values to a supply control unit 88 and based on the measured values, the supply control unit 88 can control the flow rate adjusting valves 85 and 87. Therefore, the supply control unit 88 can recognize a volume of a fluid such as the developing solution and so on passing the flowmeters 84 and 86 to open/close the flow rate adjusting valves 85 and 87 so that it is possible to have a predetermined volume of the developing solution with the high concentration and a predetermined volume of the diluting fluid flow into the tank 81.

A drainpipe 89 for draining out the developing solution stored in the tank 81 is connected to a lower part of the tank 81. A flowmeter 90 as an integrating meter and a flow rate adjusting valve 91 are provided in the drainpipe 89. A measured value of the flowmeter 90 is outputted to a drain control unit 92 so that the drain control unit 92 can recognize the flow rate flowing out of the drainpipe 89. The drain control unit 92 can operate the flow rate adjusting valve 91 so that it can control the drain volume of the developing solution drained out from the drainpipe 89 by operating the flow rate adjusting valve 91 based on the measured value of the flowmeter 90.

A solution volume sensor which is a solution volume detecting means for measuring a solution volume in the tank 81, for example, an ultrasonic sensor 93 for detecting the distance to the fluid level using an ultrasonic wave is provided, for example, in an upper part of the tank 81. A sensor which can perform successive detection is used as the ultrasonic sensor 93 and therefore the ultrasonic sensor 93 can constantly detect the solution level in the tank 81. Data detected by the ultrasonic sensor 93 is outputted to an arithmetic unit 94 and the arithmetic unit 94 calculates the solution volume in the tank 81.

The arithmetic unit 94 calculates a minimum drain volume of the developing solution to be drained out from the drainpipe 89 based on the volume and concentration of the existing developing solution in the tank 81 in order to change the developing solution in the tank 81 to be in a set volume and to have a set concentration. The arithmetic unit 94 has a program for calculating the supply volume of either the developing solution with the high concentration or the diluting fluid to be further supplied into the tank 81. The arithmetic unit 94 can output the values calculated by the program to the supply control unit 88 and the drain control unit 92. The drain control unit 92 controls the drain volume from the drainpipe 89 based on the calculated value and the supply control unit 88 controls the supply volume from the supply pipe 82 or the supply pipe 83 based on the calculated value. Therefore, the existing developing solution in the tank 81 can be changed to be in the set volume and to have the set concentration by draining out an appropriate volume of the developing solution from the tank 81 and supplying an appropriate volume of the developing solution with the high concentration or an appropriate volume of the diluting fluid into the tank.

A concentration sensor 95 as a concentration detecting means for measuring the concentration of the developing solution in the tank 81 is provided in the tank 81. The measured result of the concentration sensor 95 is outputted to the supply control unit 88 which also serves as a control mechanism of the concentration sensor 95. By the control operation of the supply control unit 88, the predetermined volume of the diluting fluid or the developing solution with the high concentration is supplied into the tank 81 to enable fine adjustment of the concentration of the developing solution in the tank 81.

A stirrer 96 for stirring the developing solution in the tank 81 is provided in the tank 81. The stirrer 96 has a propeller 97 which rotates in the developing solution and a drive section 98 provided with a motor or the like for rotating the propeller 97.

A pipe 99 for connecting the tank 81 and the developing solution supply nozzle 65 is connected to a lower surface of the tank 81 and the developing solution in the tank 81 is supplied to the developing solution supply nozzle 65 via this pipe 99. A pump P is provided in the pipe 99 and the developing solution in the tank 81 is sent to the developing solution supply nozzle 65 by the pump P. A valve 100 is provided on a downstream side of the pump P in the pipe 99 and the discharge from the developing solution supply nozzle 99 is carried out by opening/closing the valve 100.

An auxiliary supply pipe 101 as a first supply pipe for supplying the developing solution with the predetermined concentration into the pipe 99 and an auxiliary supply pipe 102 as a second supply pipe for supplying the diluting fluid into the pipe 99 are connected to an upstream part of the pipe 99 near the tank 81. The auxiliary supply pipe 101 branches off from the supply pipe 82 to be connected to the pipe 99. The auxiliary supply pipe 102 branches off from the supply pipe 83 to be connected to the pipe 99. The auxiliary supply pipe 101 is provided with an opening/closing valve 103 for starting/stopping the supply to the pipe 99 and the supply pipe 102 is provided with an opening/closing valve 104.

The valve 100, the opening/closing valve 103, and the opening/closing valve 104 are controlled by a controller 105. Therefore, it is possible to open/close the valve 100 to have the developing solution discharged from the discharge solution supply nozzle 65 and to open/close the valve 103 or the valve 104 to have the developing solution with the high concentration or the diluting fluid flow into the pipe 99 according to a command from the controller 105.

A concentration sensor 106 for measuring the concentration of the developing solution flowing through the pipe 99 is provided on a downstream side of the valve 100 near the developing solution supply nozzle 65 in the pipe 99. A measured value of the concentration sensor 106 is outputted to the controller 105 so that the controller 105 can open/close the valve 100 based on the measured value of the concentration sensor 106.

Next, the operations of the developing unit 18 and the developing solution supply apparatus 80 as structured above will be explained along with the steps of the photolithography process carried out in the coating and developing system 1.

First, an unprocessed wafer W is taken out of the cassette C by the wafer carrier 7 one by one, and then carried into the adhesion unit 31 included in the third processing unit group G3, and an adhesion promoter, for example, HMDS or the like, for improving fixability of the resist solution is applied on the wafer W in the unit. Next, the wafer W is carried to the cooling unit 30 by the main carrier 13 to be cooled to a predetermined temperature. Thereafter, the wafer W is carried to the resist coating unit 17 or 19 and the resist film is formed on the wafer W. The wafer W with the resist film formed thereon is carried to the pre-baking unit 33 or 34 and to the extension and cooling unit 40 in sequence by the main carrier 13. After that, the wafer W is carried to the edge exposure unit 51 and the aligner (not shown) in sequence by the wafer carrier 50 to undergo predetermined treatments in the respective processing units. Thereafter, the wafer W, after carried to the post-exposure baking units 44 or 45 and the cooling unit 43 in sequence by the main carrier 13 to undergo predetermined processing, is carried to the developing unit 18 or 20.

Then, the wafer W after undergoing the developing treatment is carried again to the post-baking unit 35 or 46 and the cooling unit 30 in sequence by the main carrier 13 to undergo predetermined processing in the respective units, and thereafter, the wafer W is returned to the cassette C by the wafer carrier 7 via the extension unit 32 to finish a series of the coating and developing treatment.

Next, the operations of the developing unit 18 and the developing solution supply apparatus 80 described above will be explained in detail. When the wafer W is carried into the developing unit 18 by the main carrier 13, the wafer W is held on the spin chuck 60 by suction to be accommodated in the cup 62. Next, the developing solution supply nozzle 65 is transferred from the washing tank 71 to a position above the receiving vessel 70. Then, the valve 100 of the developing solution supply apparatus 80 is opened to have the developing solution in the tank 81 discharged from the developing solution supply nozzle 65 to the receiving vessel 70. When the discharge state of the developing solution from the developing solution supply nozzle 65 becomes stable, the developing solution supply nozzle 65 is moved in a positive direction of the X-direction. At this time, the developing solution supply nozzle 65 moves above the wafer W while discharging the developing solution to form a solution film made of the developing solution on the wafer W. When the developing solution supply nozzle 65 reaches a negative side of the X-direction of the wafer W, the discharge of the developing solution supply nozzle 65 is stopped and it is returned to the washing tank 71.

Next, the washing fluid supply nozzle 72 is transferred to the position above the center of the wafer W while the wafer W is rotated by the spin chuck 61 at a predetermined rotational speed. The washing fluid is supplied to the center of the wafer W from the washing fluid supply nozzle 72 and dispersed onto the entire surface of the wafer W due to a centrifugal force so that the surface of the wafer W is washed. Thereafter, the supply of the washing fluid is stopped and the wafer W is rotated at a further higher speed. By this rotation, the washing fluid on the wafer W is scattered around and is dried. After a predetermined length of time passes, the rotation of the wafer W is stopped.

Thereafter, the wafer W is carried out of the developing unit 18 by the main carrier 13 to finish a series of the developing treatment.

Figure 8:
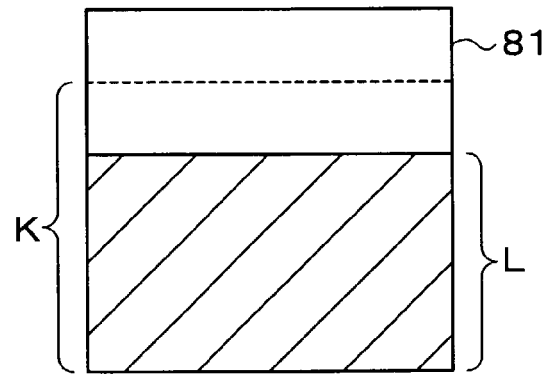
FIG. 8 is an explanatory view showing a solution volume in a tank.

Subsequently, a case when a concentration D1 of the existing developing solution is changed to a concentration D2 will be explained. First, the intended concentration D2 and an intended solution volume K after this change of the developing solution is made are set in the arithmetic unit 94 of the developing solution supply apparatus 80. A solution volume L remaining in the tank 81 at this time is shown in FIG. 8. The level of the existing developing solution in the tank 81 is detected by the ultrasonic sensor 93 and the solution volume L existing in the tank 81 is calculated by the arithmetic unit 94.

Then, based on the concentration D1 and the solution volume L of the existing developing solution, the set concentration D2, and the set solution volume K, the program incorporated in the arithmetic unit 94 calculates a minimum drain volume M to be drained out from the tank 81 and a supply volume N of either the developing solution with the high concentration (for example, a stock solution of the developing solution) or the diluting fluid to be supplied into the tank. At this time, when the set concentration D2 is higher than the concentration D1 of the existing developing solution, the supply volume N of the developing solution with the high concentration is calculated, while, when the set concentration D2 is lower than the concentration D1 of the existing developing solution, the supply volume N of the diluting fluid is calculated.

Figure 9:
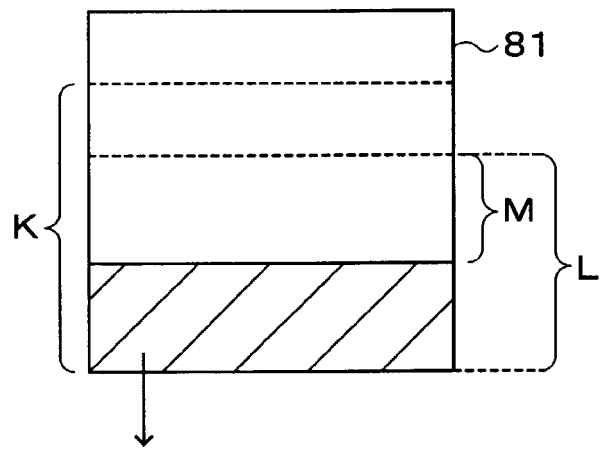
FIG. 9 is an explanatory view showing a solution volume in the tank.
Figure 10:
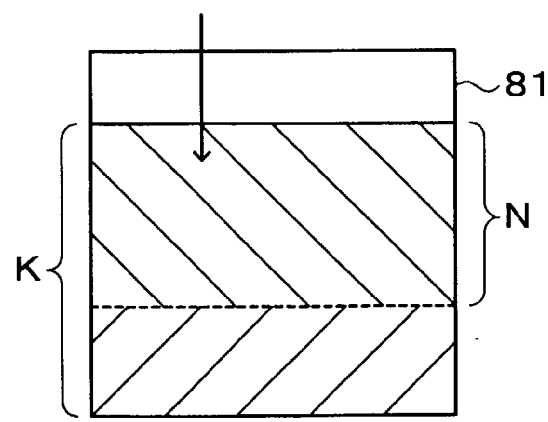
FIG. 10 is an explanatory view showing a solution volume in the tank.

Subsequently, the calculated drain volume M is outputted to the drain control unit 92 and based on this output, the drain control unit 92 adjusts the flow rate adjusting valve 91 while checking the flowmeter 90 so that the drain volume M of the existing developing solution is drained out from the tank 81 as shown in FIG. 9. Next, the supply control unit 88 adjusts the flow rate adjusting valve 85 or the flow rate adjusting valve 87 while checking the flowmeter 84 or the flowmeter 86 based on the supply volume N calculated by the arithmetic unit 94 so that the supply volume N of either the developing solution with the high concentration or the diluting fluid is supplied into the tank 81 as shown in FIG. 10. This causes the developing solution in the tank 81 to have substantially the set concentration D2 and to be substantially in the set volume K.

Thereafter, the propeller 97 is rotated by the drive section 98 to stir the developing solution in the tank 81. The concentration sensor 95 operates to accurately measure the concentration of the developing solution in the tank 81. Its measured value is outputted to the supply control unit 88, and for example, when the concentration in the tank 81 is within a permissible range relative to the set concentration D2, this state is maintained, while, when it is outside the permissible range, either one of the flow rate adjusting valve 85 and 87 is opened to make fine adjustment of the concentration in the tank 81. This can strictly adjust the concentration of the developing solution in the tank 81.

When the concentration change of the developing solution in the tank 81 is finished, the developing solution supply nozzle 65 is transferred from the washing tank 71 to the position above the receiving vessel 70. The valve 100 is opened by the controller 105 and the test discharge of the developing solution from the developing solution supply nozzle 65 is performed. This test discharge drains out the developing solution with the concentration D1 remaining in the pipe 99 to the receiving vessel 70. At this time, in the case of the concentration D2>the concentration D1, the controller 105 temporarily opens the adjusting valve 103 so that the developing solution with the high concentration is supplied into the pipe 99. After this developing solution with the high concentration is supplied for a predetermined length of time, the adjusting valve 103 is closed. Meanwhile, in the case of the concentration D2<the concentration D1, the adjusting valve 104 is temporarily opened so that the diluting fluid is supplied into the pipe 99. The operation described above promotes the change of the concentration of the developing solution discharged from the developing solution supply nozzle 65 from the concentration D1 to the concentration D2.

Furthermore, at the time of the test discharge of the developing solution, the concentration of the developing solution supplied to the developing solution supply nozzle 65 is sequentially measured in the concentration sensor 106. Then, when the original concentration D1 of the developing solution is gradually changed to the concentration D2 and the concentration sensor 106 detects the concentration D2, the valve 100 is closed to finish the test discharge. Thereafter, the developing solution supply nozzle 65 is, for example, returned to the washing tank 71 to be prepared for a developing treatment to be carried out next. Incidentally, the developing solution supply nozzle 65 may stay above the receiving vessel 70.

According to the above-described embodiment, in changing the concentration of the developing solution in the tank 81 to the set concentration D2, the ultrasonic sensor 93 measures the solution volume in the tank 81, and based on its measured value or the like, the arithmetic unit 94 calculates the minimum drain volume M to be drained out from the tank 81 and the supply volume N of either the developing solution with the high concentration or the diluting fluid to be supplied into the tank 81. Then, based on its calculated value, the developing solution in the tank 81 is drained out, and thereafter, either the developing solution with the high concentration or the diluting fluid is supplied into the tank 81. This can suppress the volume of the developing solution drained out at the time of the concentration change of the developing solution to the minimum so that the drain volume can be reduced.

Since the concentration sensor 95 is provided in the tank 81, the developing solution with the high concentration or the diluting fluid can be supplied based on the measured value of the concentration sensor 95 after the concentration is changed so that fine adjustment of the concentration of the developing solution in the tank 81 can be made. Consequently, the developing solution with a more accurate concentration can be prepared in the tank 81.

Figure 11:
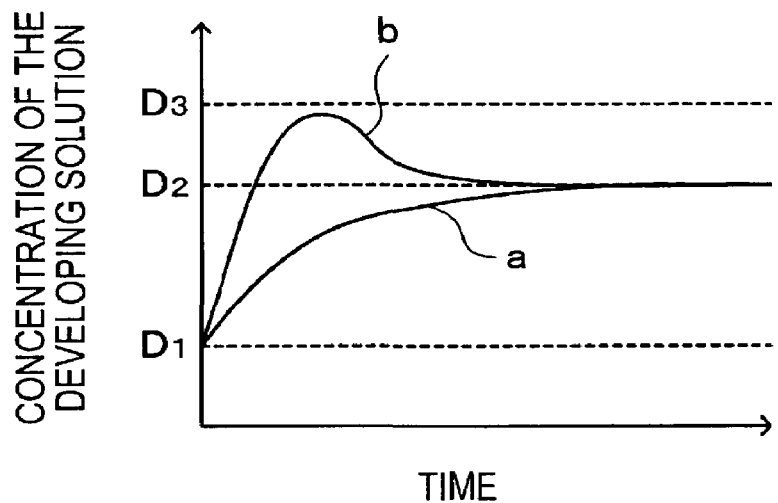
FIG. 11 is a graph showing a concentration change of a developing solution in a pipe according to time change when the concentration of the developing solution is increased.

The developing solution with the concentration D1 remaining in the pipe 99 is discharged from the developing solution supply nozzle 65 in the beginning of the test discharge of the developing solution so that the concentration of the developing solution discharged from the developing solution supply nozzle 65 usually increases slowly as time passes as shown in FIG. 11, for example, in the case of the concentration D2>the concentration D1, and it finally converges in the set concentration D2 (a curve a in FIG. 11). Note that D3 in FIG. 11 indicates the concentration of the developing solution with the high concentration.

Figure 12:
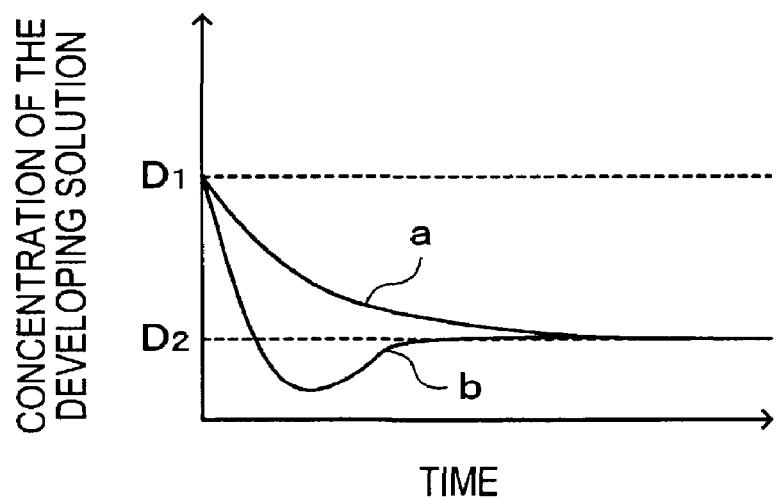
FIG. 12 is a graph showing a concentration change of the developing solution in the pipe according to time change when the concentration of the developing solution is lowered.

By supplying the developing solution with the high concentration from the auxiliary supply pipe 101 at this time as in the above-described embodiment, the concentration of the developing solution discharged from the developing solution supply nozzle 65 rapidly increases and by stopping this supply thereafter, the concentration of the developing solution converges in the set concentration D2 more quickly (a curve b in FIG. 11). Therefore, the supply of the developing solution with the high concentration into the pipe 99 at the time of the test discharge can shorten the time required for the concentration of the developing solution to converge in the set concentration D2 so that the test discharge time can be shortened. Furthermore, in the case of the concentration D2<the concentration D1, it has been also confirmed that the supply of the diluting fluid into the pipe 99 also causes the developing solution to converge in the set concentration D2 more quickly as shown in FIG. 12 so that the test discharge time can be shortened (note that a curve a in FIG. 12 indicates the concentration when the diluting fluid is not supplied and a curve b indicates the concentration when the diluting fluid is supplied).

Since the concentration sensor 106 is provided in the pipe 99, the concentration of the developing solution discharged from the discharge solution supply nozzle 65 at the time of the test discharge can be measured. Therefore, the concentration change of the developing solution discharged from the developing solution supply nozzle 65 to the set concentration D2 can be confirmed so that the discharge time can be shortened. Moreover, the discharge of the developing solution onto the wafer W before the concentration of the developing solution has not completely changed to the set concentration D is prevented so that uniformity of the developing solution supplied onto the wafer W can be secured.

In the above-described embodiment, the solution volume in the tank 81 is measured using the ultrasonic sensor 93 but it may be measured using a sensor which detects the solution volume in the tank 81 with a level detecting sensor of a different kind or by a different method, for example, a sensor for detecting the weight of the developing solution in the tank 81 and so on.

In the above-described embodiment, the supply control unit 88 and the arithmetic unit 94 are separately disposed and the drain control unit 92 and the arithmetic unit 94 are separately disposed, but the supply control unit 88 and the arithmetic unit 94, and the drain control unit 92 and the arithmetic unit 94 are integrated with each other.

Figure 13:
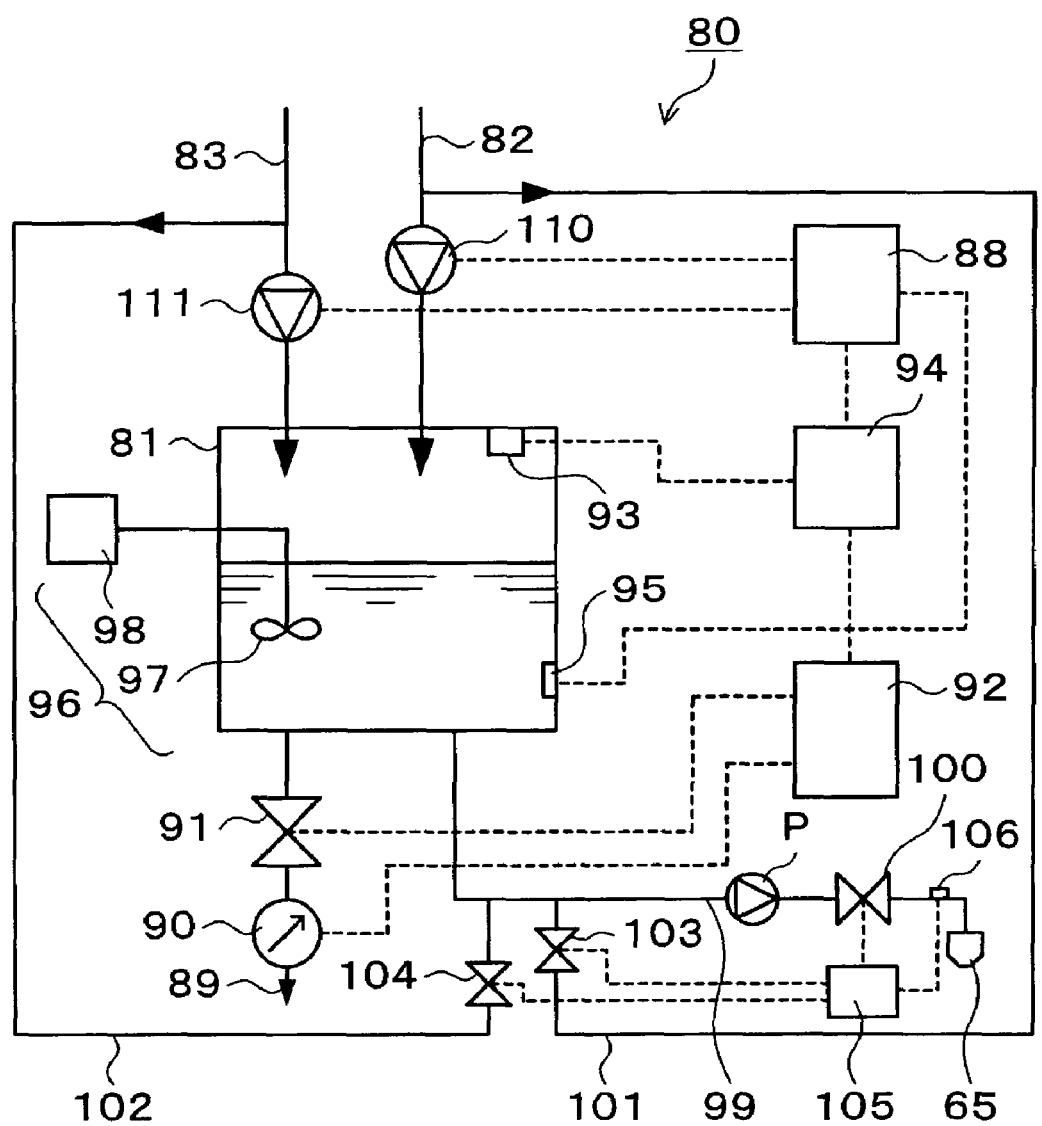
FIG. 13 is an explanatory view schematically showing the structure of the developing solution supply apparatus when a bellows pump is used therein.

In the above-described embodiment, the flow rates from the supply pipe 82 and the supply pipe 83 are controlled using the flowmeters 84 and 86 and the flow rate adjusting valves 85 and 87 but they may be controlled using pumps, for example, bellows pumps, which can send a predetermined amount of liquid in the pipes by pressure each time. For example, a pump 110 which can control the flow rate is provided in the supply pipe 82 instead of the flowmeter 84 and the flow rate adjusting valve 85 as shown in FIG. 13. Furthermore, a pump 111 which can control the flow rate is provided in the supply pipe 83 instead of the flowmeter 86 and the flow rate adjusting valve 87. The supply volumes supplied into the tank 81 from the pump 110 and the pump 111 are controlled by the supply control unit 88.

In changing the concentration of the developing solution in the tank 81 from the concentration D1 to the set concentration D2, the supply volume of the developing solution with the high concentration or the supply volume of the diluting fluid to be supplied into the tank 81 is calculated in the arithmetic unit 94 and its calculated value is outputted to the supply control unit 88 as described above. The supply control unit 88 operates either the pump 110 or the pump 111 based on the calculated value to cause an appropriate volume of the developing solution with the high concentration or the diluting fluid to flow into the tank 81. Furthermore, in the fine adjustment of the concentration of the developing solution in the tank 81, the supply control unit 88 receiving the measured value from the concentration sensor 95 also controls the pump 110 or 111 to cause an appropriate volume of the developing solution with the high concentration or the diluting fluid to be supplied into the tank 81. Thus, the use of the pump 110 and the pump 111 of a bellows type or the like enables strict control of the fluid volume flowing into the tank 81 so that the concentration of the developing solution can be adjusted accurately.

In the above-described embodiment, in draining out the existing developing solution stored in the tank 81 from the drainpipe 89, the draining of the developing solution depends on the weight of the developing solution itself but the developing solution may be drained out by supplying a gas, for example, a nitrogen gas, into the tank 81 to pressurize the inside of the tank 81. This causes the developing solution to be drained out more quickly and the time required for changing the concentration of the developing solution to be shortened.

Figure 14:
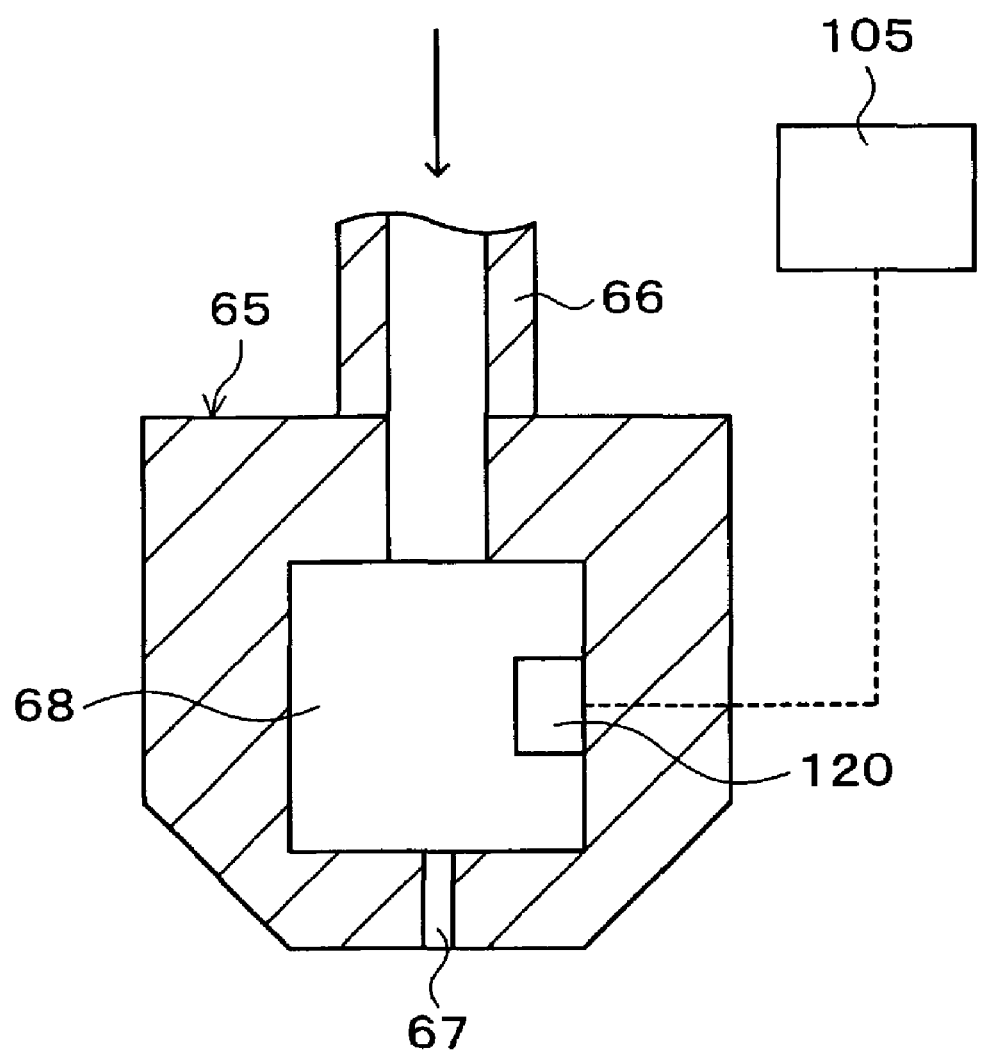
FIG. 14 is an explanatory view of a vertical cross section of the developing solution supply nozzle with a concentration sensor provided therein.

In the above-described embodiment, the concentration sensor 106 for measuring the concentration of the developing solution discharged from the developing solution supply nozzle 65 is disposed near the developing solution supply nozzle 65 in the pipe 99 but it may be disposed in the body of the developing solution supply nozzle 65. The developing solution supply nozzle 65 shown in FIG. 14 is one example of such a structure, in which a concentration sensor 120 is disposed, for example, in the storage portion 68 of the developing solution supply nozzle 65. Thereby, the concentration of the developing solution immediately before it is discharged from the developing solution supply nozzle 65 can be measured, and therefore, the concentration change of the developing solution can be more accurately recognized than in the case when the concentration sensor 120 is disposed in the pipe 99.

Figure 15:
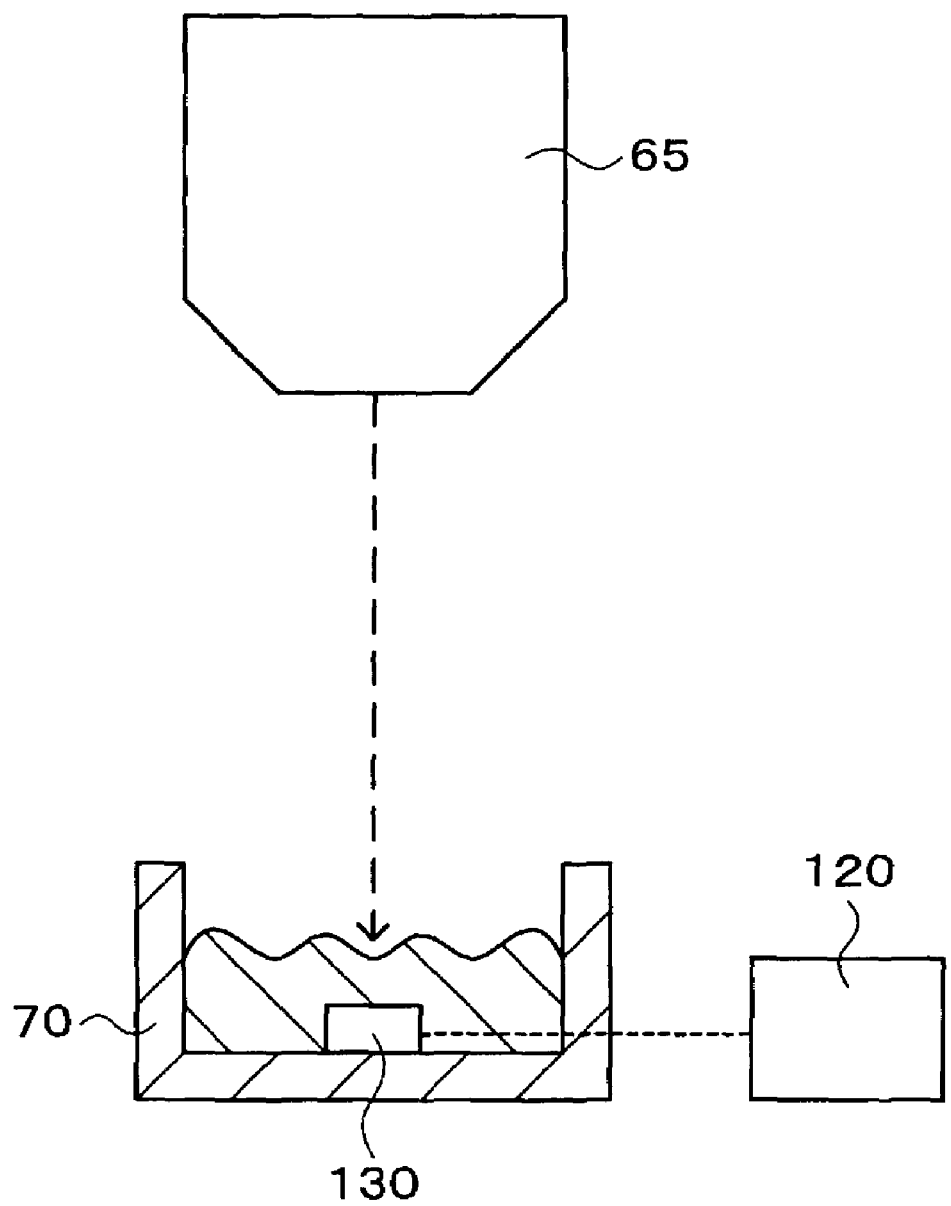
FIG. 15 is an explanatory view of a cross section of a receiving vessel with a concentration sensor provided therein.

Moreover, a concentration sensor may be disposed in the receiving vessel 70 of the developing unit 18. The receiving vessel 70 shown in FIG. 15 shows one example of such a structure, in which a concentration sensor 130 is disposed inside the receiving vessel 70. This not only makes it possible to measure the concentration of the developing solution immediately after it is discharged from the developing solution supply nozzle 65 but also makes it possible to easily install the concentration sensor 130.

Figure 16:
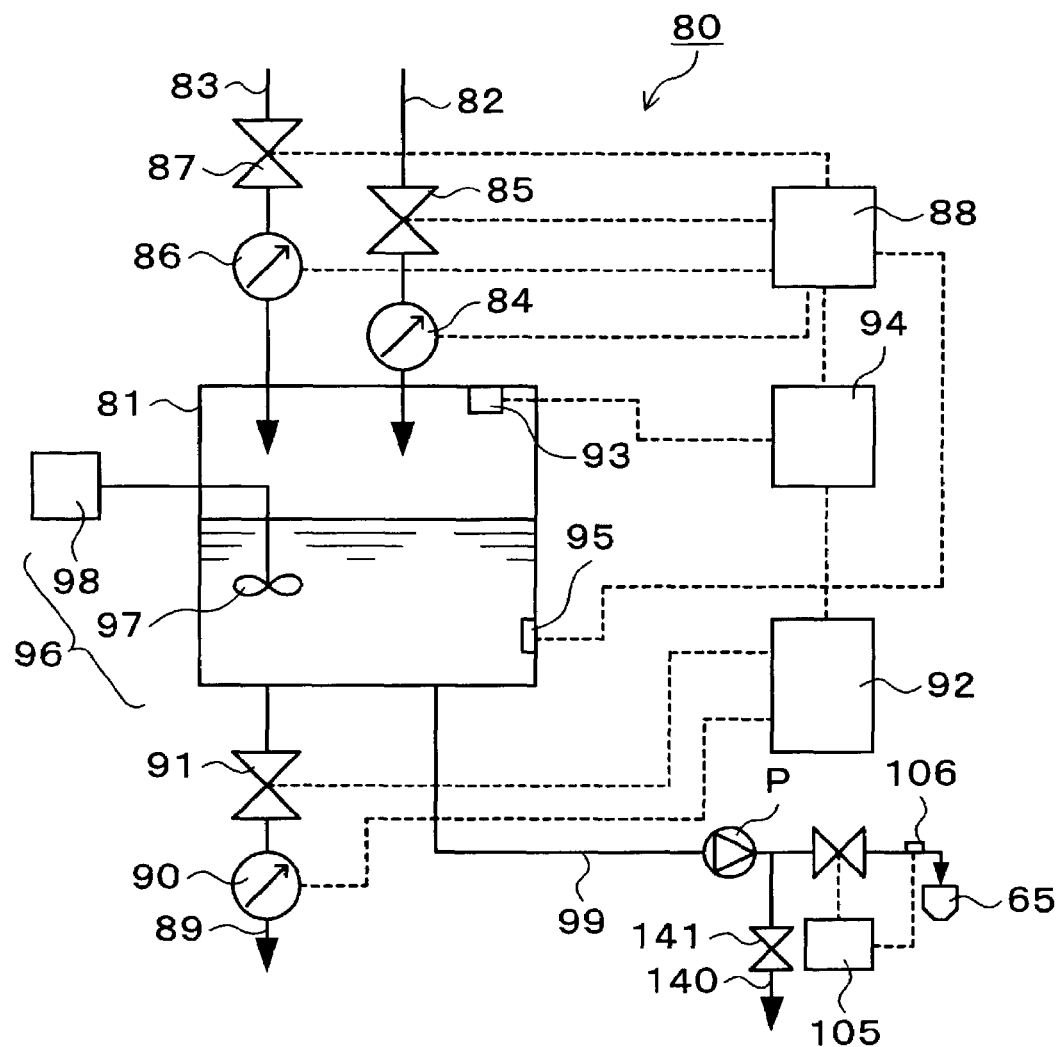
FIG. 16 is an explanatory view schematically showing the structure of the developing solution supply apparatus when an auxiliary drainpipe is provided in the pipe.

In the above-described embodiment, the auxiliary supply pipes 101 and 102 are connected to the pipe 99 to supply the developing solution with the high concentration or the diluting fluid into the pipe 99 at the time of the test discharge but an auxiliary drainpipe for draining out the developing solution remaining in the pipe 99 may be provided, omitting the auxiliary supply pipes 101 and 102. For example, an auxiliary drainpipe 140 is disposed on an upstream side of the valve 100 of the pipe 99 as shown in FIG. 16. An opening/closing valve 141 is provided in the auxiliary drainpipe 140. Before the test discharge is performed after the concentration of the developing solution in the tank 81 is changed, the opening/closing valve 141 is opened to have the developing solution remaining in the pipe 99 drained out. Then, after the pipe 99 becomes empty, the test discharge is performed. By draining out the developing solution remaining in the pipe 99 in this way, the developing solution in the tank 81 flows through the pipe 99 from the beginning at the subsequent test discharge, so that the developing solution with the set concentration D2 is immediately discharged from the developing solution supply nozzle 65, and consequently, the time required for the test discharge can be shortened.

Figure 17:
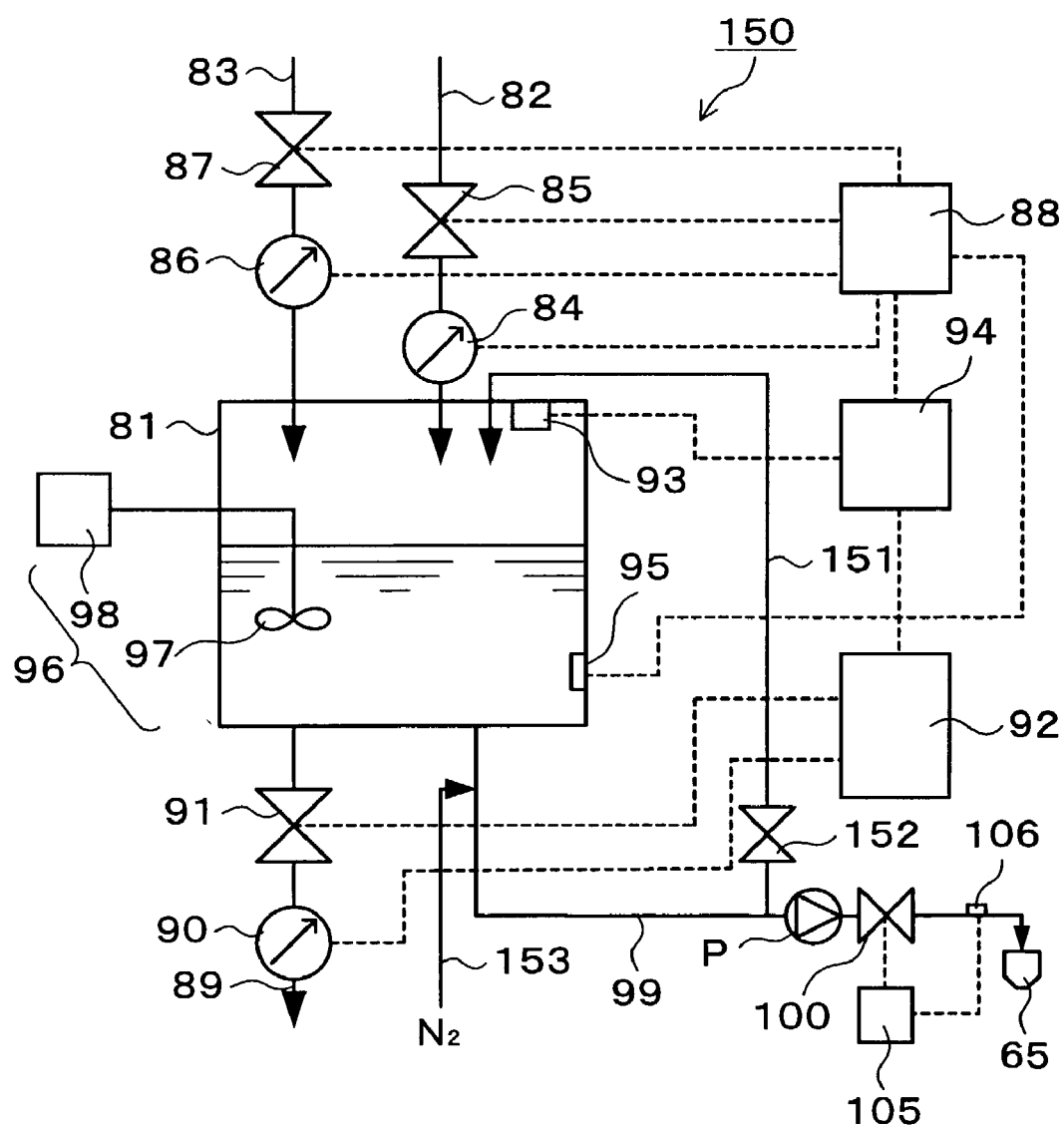
FIG. 17 is an explanatory view schematically showing the structure of a developing solution supply apparatus when a return passage is provided therein.

Furthermore, a return passage for returning the developing solution remaining in the pipe 99 to the tank 81 may be provided in the pipe 99. A developing solution supply apparatus 150 shown in FIG. 17, which shows one example of such a structure, includes a return passage 151 disposed on the upstream side of the valve 100 in a downstream part of the pipe 99. The return passage 151 branches off from the pipe 99 to be connected to the tank 81. In the return passage 151, an opening/closing valve 152 is provided. In the pipe 99, a pipe passage 153 via which a gas, for example, a nitrogen gas, is sent into the pipe 99 is provided on an upstream side of a position where the return passage 151 branches off. This structure makes it possible to supply the gas into the pipe 99, send the developing solution remaining in the pipe 99 by pressure, and return the remaining developing solution to the tank 81 via the return passage 151.

Before the solution volume L in the tank 81 is measured by the ultrasonic sensor 93 of the tank 81, the gas is supplied into the pipe 99 from the pipe passage 153 and at the same time the opening/closing valve 152 is opened to cause the developing solution remaining in the pipe 99 to flow into the tank 81 via the return pipe 151. Thereafter, as described in the above-described embodiment, the solution volume L of the developing solution in the tank 81 including the developing solution remaining in the pipe 99 is measured, and based on this measured value, the concentration of the developing solution is changed. The developing solution remaining in the pipe 99 is thus returned into the tank 81 before the solution volume L in the tank 81 is measured so that the developing solution remaining in the pipe 99 can be reused. Consequently, the drain volume at the time of the concentration change of the developing solution can be reduced. Incidentally, it is more preferable that the return passage 151 is positioned on as downstream a side as possible in the pipe 99, and thereby, more of the developing solution remaining in the pipe 99 is returned to the tank 81.

In the above-described embodiment, the supply control unit 88 also serves as the control mechanism for the concentration sensor 95 disposed in the tank 81 but a control mechanism for the concentration sensor 95 may be provided separately.

Figure 18:
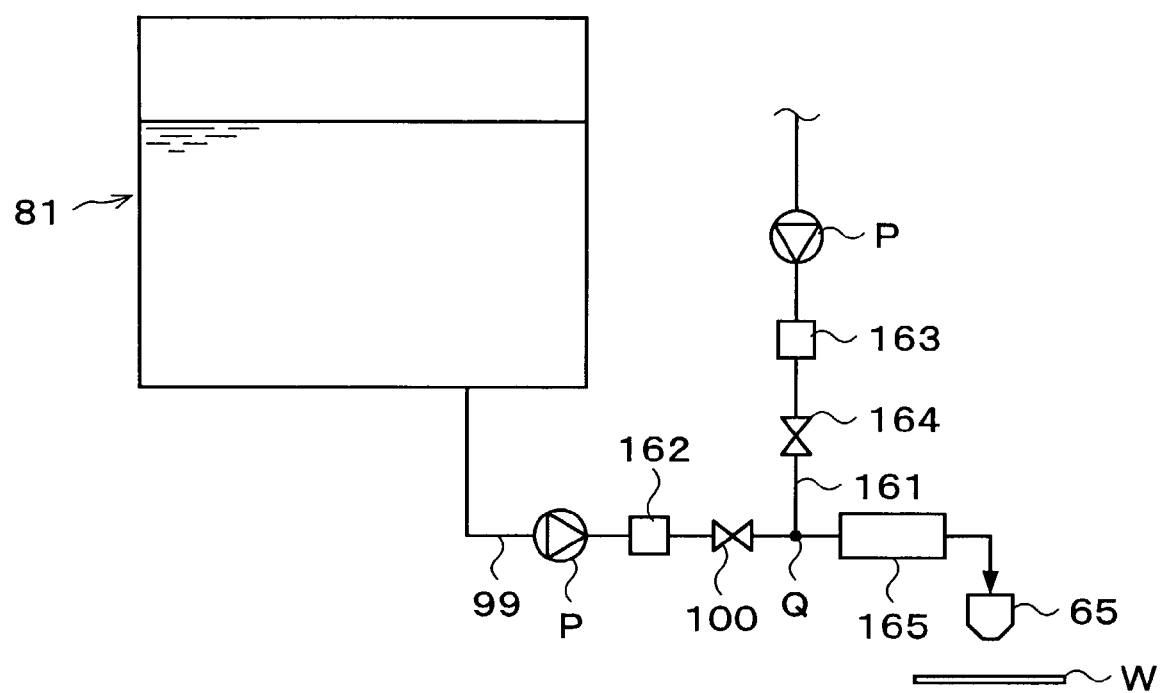
FIG. 18 is an explanatory view diagrammatically showing the structure of a unit according to an embodiment of the present invention when a step-by-step developing method is carried out.

As shown in FIG. 18, such a structure is also acceptable that a diluting fluid supply pipe 161 for supplying the diluting fluid is connected to the pipe 99 extending from the tank 81 to the developing solution supply nozzle 65 and a stirring unit 165 is provided between a downstream side of a connecting portion Q where the diluting fluid supply pipe 161 and the pipe 99 are connected and the developing solution nozzle 65. In this case, mass flow controllers 162 and 163 for adjusting the flow rate are preferably provided in the pipe 99 and the diluting fluid supply pipe 161 respectively.

According to the above-described example, in the mid course of sending the developing solution whose concentration has been adjusted to the predetermined concentration from the tank 81 to the developing solution supply nozzle 65, the diluting fluid, for example, pure water can be further supplied to the developing solution from the diluting fluid supply pipe 161 to further dilute the developing solution so that the developing solution supplied to the substrate from the developing solution supply nozzle 65 can be freely set at a predetermined concentration.

Therefore, in carrying out the developing treatment of, for example, the exposed wafer W, the diluting fluid is mixed into the developing solution from the diluting fluid supply pipe 161 first to supply the developing solution with a low concentration to the wafer W so that the developing treatment in which an initial impact given to the wafer W is suppressed can be carried out. Thereafter, the flow rate of the diluting fluid from the diluting fluid supply pipe 161 is gradually reduced, for example, step by step so that the developing solution with a normal concentration can be supplied to the wafer W.

Contrary to the above, depending on the kind of the resist solution applied on the wafer W, such a method is sometimes preferable that the developing solution with the normal concentration is supplied first, the concentration of the supplied developing solution is gradually lowered thereafter with the progress of the developing treatment, and finally the diluting fluid, for example, pure water is supplied so that the developing solution on the wafer W is replaced by the pure water to wash the wafer W. In such a case, the example shown in FIG. 18 can also be applied appropriately. Specifically, the valve 164 of the diluting fluid supply pipe 161 is first closed, the developing solution with a predetermined concentration is supplied from the tank 81, the valve 164 of the diluting fluid supply pipe 161 is opened thereafter, the flow rate of the diluting fluid from the diluting fluid supply pipe 161 is increased gradually, for example, step by step, and the valve 100 of the pipe 99 is finally closed.

In either case, the stirring unit 165 is provided between the downstream side of the connecting portion Q where the diluting fluid supply pipe 161 and the pipe 99 are connected and the developing solution supply nozzle 65 so that the developing solution with a uniform concentration is supplied from the developing solution supply nozzle 65.

Incidentally, the so-called "step-by step developing method" in which the concentration of the developing solution is changed step by step as described above can be carried out, for example, in such a manner that pipes for the stock solution of the developing solution and the diluting fluid are directly connected to the developing solution supply nozzle 65 to adjust the flow rates respectively, but the concentration can be more easily controlled when the developing solution whose concentration has been temporarily adjusted to the predetermined concentration in the tank 81 is mixed with the diluting fluid as in the example shown in FIG. 18 which is a concrete example of the present invention. Moreover, the developing solution supplied from the developing solution supply nozzle 65 can be more easily controlled on a microscopic level.

The above-described embodiment is that of the developing solution supply apparatus for supplying the developing solution to the wafer, but the present invention is also applicable to apparatuses for supplying other treatment solutions, for example, a resist solution supply apparatus for supplying a resist solution, a washing fluid supply apparatus for supplying a washing fluid, and so on. Furthermore, in the above-described embodiment, the substrate to be treated is the wafer, but the present invention is also applicable to treatment solution supply apparatuses for supplying treatment solutions to other substrates, for example, to an LCD substrate.

The present invention can reduce the drain volume in changing the concentration of the treatment solution so that the consumption volume of the treatment solution is reduced accordingly, and thereby, cost reduction can be achieved. Moreover, the time required for the concentration change can be shortened so that the time required for the substrate treatment, which is interrupted due to the concentration change, is shortened, and thereby, a total throughput can be improved.

What is claimed is:

1. A treatment solution supply apparatus for supplying a treatment solution to a substrate, comprising:
    a tank for storing the treatment solution;
    a first pipe for connecting said tank to a treatment solution supply section for supplying the treatment solution to the substrate;
    a treatment solution supply pipe for supplying the treatment solution with a predetermined concentration into said tank;
    a diluting fluid supply pipe for supplying a diluting fluid into said tank;
    a solution volume sensor for measuring a solution volume in said tank;
    a drainpipe for draining out the treatment solution from said tank;
    a drainpipe flowmeter provided along said drainpipe and configured to measure a drain volume of the treatment solution flowing through said drainpipe;
    a concentration sensor for directly measuring a concentration of an existing treatment solution in said tank;
    an arithmetic unit for calculating a drain volume of the existing treatment solution to be drained out from said drainpipe and calculating a supply volume of the treatment solution with the predetermined concentration to be supplied from said treatment solution supply pipe or a supply volume of the diluting fluid to be supplied from said diluting fluid supply pipe respectively, in order to change the existing treatment solution in the tank to be in an intended volume and to have an intended concentration;
    a supply control unit for controlling the supply volume from said treatment solution supply pipe and said diluting fluid supply pipe based on a resultant value of the calculation; and
    a drain control unit for controlling the drain volume as measured by the drainpipe flowmeter of the existing treatment solution from said drainpipe based on a resultant value of the calculation,
    wherein the drainpipe is configured to carry substantially all of the solution flowing through the drainpipe outside of the apparatus.

2. A treatment solution supply apparatus according to claim 1,
    wherein said first pipe includes a return passage for returning the treatment solution in said first pipe into said tank.

3. A treatment solution supply apparatus according to claim 1,
    wherein said first pipe includes a first supply pipe for supplying the treatment solution with the predetermined concentration into said first pipe and a second supply pipe for supplying the diluting fluid into said first pipe.

4. A treatment solution supply apparatus according to claim 1,
    wherein said first pipe includes an auxiliary drainpipe for draining out the treatment solution in said first pipe.

5. A treatment solution supply apparatus according to claim 1, further comprising:
    another diluting fluid supply pipe for supplying the diluting fluid to said first pipe; and
    a stirring unit disposed between a downstream side of a connecting portion where said another diluting fluid supply pipe and said first pipe are connected and said treatment solution supply section.

6. A treatment solution supply apparatus for supplying a treatment solution to a substrate, comprising:
    a tank for storing the treatment solution;
    a first pipe for connecting said tank to a treatment solution supply section for supplying the treatment solution to the substrate;
    a treatment solution supply pipe for supplying the treatment solution with a predetermined concentration into said tank;
    a diluting fluid supply pipe for supplying a diluting fluid into said tank;
    a solution volume sensor for measuring a solution volume in said tank;

a drainpipe for draining out the treatment solution from said tank;

a drainpipe flowmeter provided along said drainpipe and configured to measure a drain volume of the treatment solution flowing through said drainpipe;

an arithmetic unit for calculating a drain volume of an existing treatment solution to be drained out from said drainpipe and calculating a supply volume of the treatment solution with the predetermined concentration to be supplied from said treatment solution supply pipe or a supply volume of the diluting fluid to be supplied from said diluting fluid supply pipe respectively, in order to change the existing treatment solution in the tank to be in an intended volume and to have an intended concentration;

a supply control unit for controlling the supply volume from said treatment solution supply pipe and said diluting fluid supply pipe based on a resultant value of the calculation;

a drain control unit for controlling the drain volume of the existing treatment solution from said drainpipe based on a resultant value of the calculation;

a concentration sensor for directly measuring the concentration of the treatment solution in said tank; and a controller for controlling the supply from said treatment solution supply pipe and said diluting fluid supply pipe based on a value measured by said concentration sensor.

7. A treatment solution supply apparatus for supplying a treatment solution to a substrate, comprising:

a tank for storing the treatment solution;

a first pipe for connecting said tank to a treatment solution supply section for supplying the treatment solution to the substrate;

a treatment solution supply pipe for supplying the treatment solution with a predetermined concentration into said tank;

a diluting fluid supply pipe for supplying a diluting fluid into said tank;

a solution volume sensor for measuring a solution volume in said tank;

a drainpipe for draining out the treatment solution from said tank;

a drainpipe flowmeter provided along said drainpipe and configured to measure a drain volume of the treatment solution flowing through said drainpipe;

a concentration sensor for directly measuring a concentration of an existing treatment solution in said tank;

an arithmetic unit for calculating a drain volume of the existing treatment solution to be drained out from said drainpipe and calculating a supply volume of the treatment solution with the predetermined concentration to be supplied from said treatment solution supply pipe or a supply volume of the diluting fluid to be supplied from said diluting fluid supply pipe respectively, in order to change the existing treatment solution in the tank to be in an intended volume and to have an intended concentration;

a supply control unit for controlling the supply volume from said treatment solution supply pipe and said diluting fluid supply pipe based on a resultant value of the calculation;

a drain control unit for controlling the drain volume of the existing treatment solution from said drainpipe based on a resultant value of the calculation; and a concentration sensor for directly measuring a concentration of the treatment solution traveling from said tank in said first pipe.

8. A treatment solution supply apparatus for supplying a treatment solution to a substrate, comprising:

a tank for storing the treatment solution;

a first pipe for connecting said tank to a treatment solution supply section for supplying the treatment solution to the substrate;

a treatment solution supply pipe for supplying the treatment solution with a predetermined concentration into said tank;

a diluting fluid supply pipe for supplying a diluting fluid into said tank;

a solution volume sensor for measuring a solution volume in said tank;

a drainpipe for draining out the treatment solution from said tank;

a drainpipe flowmeter provided along said drainpipe and configured to measure a drain volume of the treatment solution flowing through said drainpipe;

a concentration sensor for directly measuring a concentration of an existing treatment solution in said tank;

an arithmetic unit for calculating a drain volume of the existing treatment solution to be drained out from said drainpipe and calculating a supply volume of the treatment solution with the predetermined concentration to be supplied from said treatment solution supply pipe or a supply volume of the diluting fluid to be supplied from said diluting fluid supply pipe respectively, in order to change the existing treatment solution in the tank to be in an intended volume and to have an intended concentration;

a supply control unit for controlling the supply volume from said treatment solution supply pipe and said diluting fluid supply pipe based on a resultant value of the calculation;

a drain control unit for controlling the drain volume of the existing treatment solution from said drainpipe based on a resultant value of the calculation; and a concentration sensor for directly measuring a concentration of the treatment solution discharged from a storage portion of said treatment solution supply section provided within a supply nozzle.

9. A treatment solution supply apparatus for supplying a treatment solution to a substrate, comprising:

a tank for storing the treatment solution;

a first pipe for connecting said tank to a treatment solution supply section for supplying the treatment solution to the substrate;

a treatment solution supply pipe for supplying the treatment solution with a predetermined concentration into said tank;

a diluting fluid supply pipe for supplying a diluting fluid into said tank;

a solution volume sensor for measuring a solution volume in said tank;

a drainpipe for draining out the treatment solution from said tank;

a drainpipe flowmeter provided along said drainpipe and configured to measure a drain volume of the treatment solution flowing through said drainpipe;

a concentration sensor for directly measuring a concentration of an existing treatment solution in said tank;

an arithmetic unit for calculating a drain volume of the existing treatment solution to be drained out from said drainpipe and calculating a supply volume of the treatment solution with the predetermined concentration to be supplied from said treatment solution supply pipe or a supply volume of the diluting fluid to be supplied from said diluting fluid supply pipe respectively, in order to change the existing treatment solution in the tank to be in an intended volume and to have an intended concentration;

a supply control unit for controlling the supply volume from said treatment solution supply pipe and said diluting fluid supply pipe based on a resultant value of the calculation;

a drain control unit for controlling the drain volume of the existing treatment solution from said drainpipe based on a resultant value of the calculation; and a concentration sensor, which is provided in a receiving vessel for receiving the treatment solution of which a test discharge is performed, for directly measuring a concentration of the received treatment solution when the test discharge of the treatment solution is performed from said treatment solution supply section.

10. A treatment solution supply apparatus for supplying a treatment solution to a substrate, comprising:

a tank for storing the treatment solution;

a first pipe for connecting said tank to a treatment solution supply section for supplying the treatment solution to the substrate;

a treatment solution supply pipe for supplying the treatment solution with a predetermined concentration into said tank;

a diluting fluid supply pipe for supplying a diluting fluid into said tank;

a solution volume sensor for measuring a solution volume in said tank;

a drainpipe for draining out the treatment solution from said tank;

a drainpipe flowmeter provided along said drainpipe and configured to measure a drain volume of the treatment solution flowing through said drainpipe;

a concentration sensor for directly measuring a concentration of an existing treatment solution in said tank;

an arithmetic means for calculating a drain volume of the existing treatment solution to be drained out from said drainpipe and calculating a supply volume of the treatment solution with the predetermined concentration to be supplied from said treatment solution supply pipe or a supply volume of the diluting fluid to be supplied from said diluting fluid supply pipe respectively, in order to change the existing treatment solution in the tank to be in an intended volume and to have an intended and variable concentration;

a supply control unit for controlling the supply volume from said treatment solution supply pipe and said diluting fluid supply pipe based on a resultant value of the calculation; and a drain control unit for controlling the drain volume of the existing treatment solution from said drainpipe based on a resultant value of the calculation.

* * * * *